(12) United States Patent
Tashiro et al.

(10) Patent No.: US 8,564,318 B2
(45) Date of Patent: Oct. 22, 2013

(54) SEMICONDUCTOR DEVICE HAVING CMOS TRANSFER CIRCUIT AND CLAMP ELEMENT

(71) Applicant: Renesas Electronics Corporation, Kawasaki (JP)

(72) Inventors: Shinya Tashiro, Yokohama (JP); Kazutaka Taniguchi, Yokohama (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/830,771

(22) Filed: Mar. 14, 2013

(65) Prior Publication Data

US 2013/0200935 A1     Aug. 8, 2013

Related U.S. Application Data

(63) Continuation of application No. 12/656,453, filed on Jan. 29, 2010, now Pat. No. 8,421,489.

(30) Foreign Application Priority Data

Feb. 3, 2009   (JP) ................................. 2009-022764

(51) Int. Cl.
    *G01R 31/3187*   (2006.01)
(52) U.S. Cl.
    USPC ........................................ 324/750.3; 365/201
(58) Field of Classification Search
    USPC ........................................ 324/750.3; 365/201
    See application file for complete search history.

(56) References Cited

U.S. PATENT DOCUMENTS

| | | | |
|---|---|---|---|
| 5,592,423 A | 1/1997 | Tokami | |
| 5,594,694 A | 1/1997 | Roohparvar et al. | |
| 5,850,359 A | 12/1998 | Liu | |
| 5,852,540 A | 12/1998 | Haider | |
| 6,049,445 A | 4/2000 | Gauthier et al. | |
| 6,285,600 B1 | 9/2001 | Mullarkey | |
| 7,372,746 B2 | 5/2008 | Kim | |
| 7,382,674 B2 | 6/2008 | Hirabayashi | |
| 7,738,312 B2 * | 6/2010 | Shimano et al. | 365/230.05 |
| 8,018,757 B2 * | 9/2011 | Kawasumi et al. | 365/154 |
| 2009/0206821 A1 | 8/2009 | Meterelliyoz et al. | |

FOREIGN PATENT DOCUMENTS

JP            3583482          8/2004

OTHER PUBLICATIONS

United States Office Action dated Feb. 29, 2012, in U.S. Appl. No. 12/656,453.
United States Office Action dated Sep. 28, 2012, in U.S. Appl. No. 12/656,453.

* cited by examiner

*Primary Examiner* — Arleen M Vazquez
(74) *Attorney, Agent, or Firm* — McGinn IP Law Group, PLLC (57) ABSTRACT

A semiconductor device includes a power-supply circuit which produces a first voltage potential, a first terminal, a second terminal which receives a mode signal, an inverter which receives the mode signal and outputs an inverted mode signal, and a first transfer circuit which includes a first transistor of a first conductivity type and a second transistor of a second conductivity type, the first transistor coupled between the power-supply circuit and a first node, the second transistor coupled between the power-supply circuit and the first node in parallel with the first transistor, a control gate of the first transistor supplied with the inverted mode signal and a control gate of the second transistor supplied with the mode signal.

7 Claims, 6 Drawing Sheets

SEMICONDUCTOR DEVICE HAVING CMOS TRANSFER CIRCUIT AND CLAMP ELEMENT

INCORPORATION BY REFERENCE

The present application is a Continuation Application of U.S. patent application Ser. No. 12/656,453, filed on Jan. 29, 2010, which is based on and claims priority from Japanese patent application No. 2009-022764, filed on Feb. 3, 2009, the entire contents of which is incorporated herein by reference.

BACKGROUND OF THE INVENTION

1. Field of the Invention

The present invention relates to a semiconductor device and, more particularly, to a semiconductor device provided with a measurement circuit of internal power-supply voltage.

2. Description of Related Art

In recent years, the power-supply voltage circuit of a semiconductor device has become complex and a plurality of internal power-supply voltages, such as a step-down voltage, a step-up voltage, a negative voltage, and a half VCC, which is ½ of a power-supply voltage, are used in one chip. Furthermore, because the breakdown voltage of a device has become lower due to miniaturization, the trend toward lower voltages has become more prevalent. When different voltages are generated within a device, this destroys the device or worsens the characteristics of the device. Therefore, an improvement in the accuracy of an internal power-supply voltage is required.

In order to obtain high-accuracy potentials, it is necessary to measure internal potentials. Parallel measurements have been increasingly adopted in order to reduce measurement cost in measurements on a wafer. However, because the number of test pins in a test device is insufficient, there has been increasing need for a measurement circuit of internal power-supply voltage which can be shared with external pins and permits high-accuracy measurements at low voltages.

In taking out an internal potential of a mold-resin sealed chip from the chip and measuring the potential, it is necessary that an external terminal and a terminal for outputting the internal potential be shared. In the case where terminals are shared like this, it has become an important problem to take measures to ensure that even when overshoots of not less than a power-supply voltage or undershoots of not more than GND enter external pins, this does not affect the internal potential.

Figure 6:
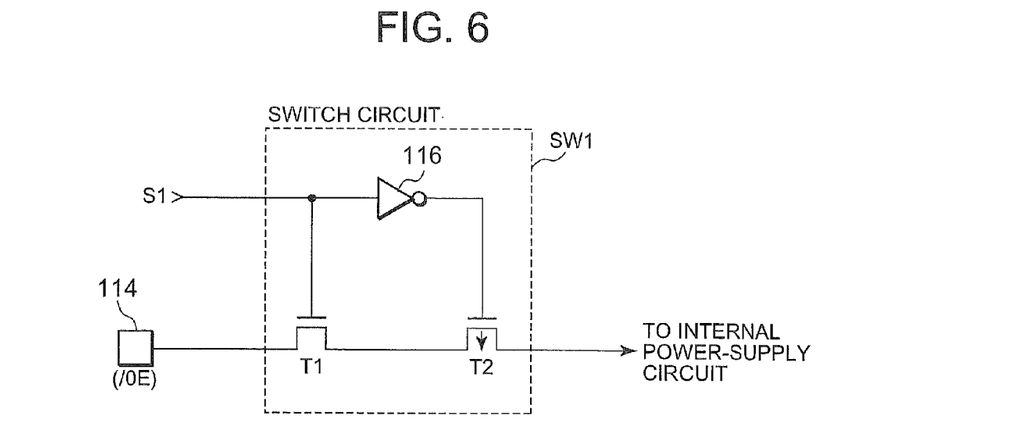
FIG. 6 is a circuit diagram showing the configuration of the semiconductor device described in Patent Document.

FIG. 6 shows a circuit configuration of a switch circuit described in Japanese Patent No. 3583482. As shown in FIG. 6, the switch circuit has such a configuration that an n-channel MOS transistor T1 and a p-channel MOS transistor T2 are connected in series. An external terminal 114 is connected to a drain of the MOS transistor T1. Sources of the n-channel MOS transistor T1 and the p-channel MOS transistor T2 are connected together, and a drain of the p-channel MOS transistor T2 and an internal power-supply circuit are connected together.

A test mode specifying signal, for example, S1 in FIG. 6 is inputted to a gate of the n-channel MOS transistor T1. A test mode specifying signal S1 inverted by an inverter 116 is inputted to a gate of the p-channel MOS transistor T2. Therefore, the switch circuit shown in FIG. 6 comes to an on state when the test mode specifying signal S1 is HIGH and comes to an off state when the test mode specifying signal S1 is LOW.

Figure 7:
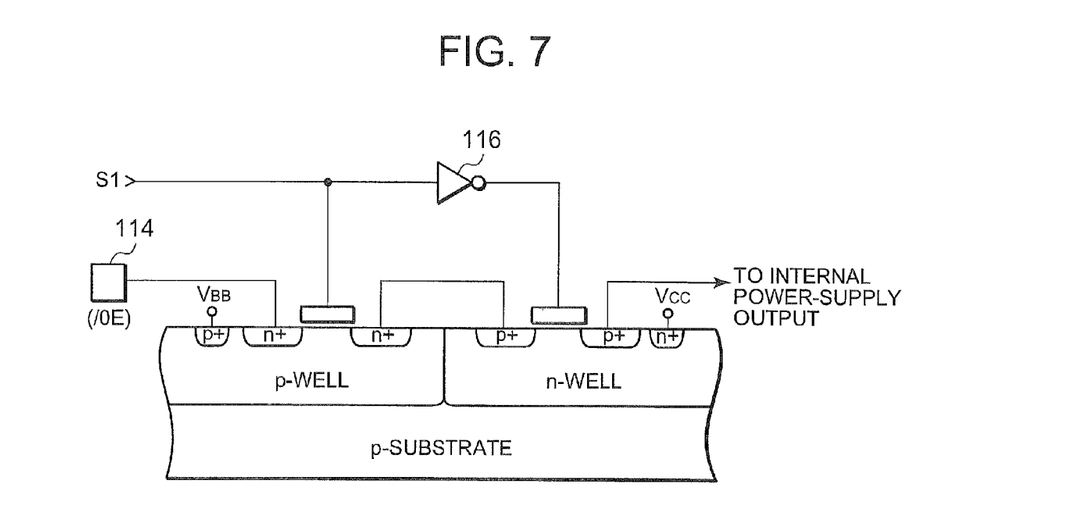
FIG. 7 is a layout sectional view of the semiconductor device shown in FIG. 6.

With the aid of FIG. 7, a description will be given here of the cut-off characteristics for a voltage inputted to the switch from the external terminal 114. FIG. 7 is a diagram showing the cross section of portions corresponding to the n-channel MOS transistor T1 and p-channel MOS transistor T2 of the switch circuit of FIG. 6. In the example shown in FIG. 7, a case where a p-type Si substrate is used is shown diagrammatically.

As shown in FIG. 7, the n-channel MOS transistor is formed in a p-well and the p-channel MOS transistor is formed in an n-well. Usually, a p-well is biased to a GND potential VSS or a substrate bias VBB. An n-well is biased to ext. VCC, an external power-supply voltage.

Therefore, when the test mode specifying signal SI comes to a HIGH state (=ext. VCC), an n-type inversion layer is formed just under the gate of the n-channel MOS transistor and conduction occurs. And a LOW state (=0 V) is applied to the gate of the p-channel MOS transistor, a p-type inversion layer is formed just under the gate, and conduction occurs.

When the potential of the external terminal 114 exceeds a VCC and overshoots to a positive value, because the gate potential of the n-channel MOS transistor gate is a VCC, the n-type inversion layer disappears in the vicinity of the drain of the n-channel MOS transistor and the conducting state becomes cut off. On the other hand, when the potential of the external terminal 114 becomes lower than 0 V and undershoots to a negative value, because the gate potential of the p-channel MOS transistor is 0 V, the p-type inversion layer disappears in the vicinity of the source of the p-channel MOS transistor and the conducting state becomes cut off.

As described above, in the switch circuit of FIG. 6, because the n-channel MOS transistor and the p-type MOS transistor are connected in series, the conducting state becomes cut off both when the potential of the external terminal 114 overshoots to a positive value and when the potential of the external terminal 114 undershoots to a negative value. As a result, an overshooting voltage or an undershooting voltage is not applied directly to the internal circuit connected to the internal power-supply circuit and it is possible to prevent internal stored information and the like from being destroyed.

SUMMARY

In the semiconductor device shown in FIG. 6, a threshold value (hereinafter referred to as "VT") of a transistor constituting the transfer circuit has an effect and, therefore, this poses the problem that it is impossible to accurately output an internal potential to outside the chip.

In the circuit shown in FIG. 6, a threshold value of the n-channel MOS (hereinafter referred to as "NMOS") is called VTN. When the internal power-supply voltage is higher than (VCC−VTN), the transfer circuit of NMOS becomes off and it is impossible to output an accurate internal power-supply voltage to the external terminal 114. A threshold value of the p-channel MOS (hereinafter referred to as "PMOS") is called VTP. When the internal power-supply voltage is lower than VTP, the transfer circuit of PMOS becomes off and it is impossible to accurately output an accurate voltage to the external terminal 114.

Hence, the internal power-supply voltage capable of being measured in the semiconductor device shown in FIG. 6 becomes the voltage of VTP to (VCC−VTN) of a transistor constituting the transfer circuit. For example, if the VT of the transistors PMOS and NMOS constituting the transfer circuits is both 0.5 V when the power-supply voltage is 1.3 V, then internal power-supply voltages capable of being measured become 0.5 V to 0.8 V. When the temperature dependence and SUB dependence of VT and the like are taken into consideration, the range of temperatures capable of being measured becomes narrower.

Figure 5:
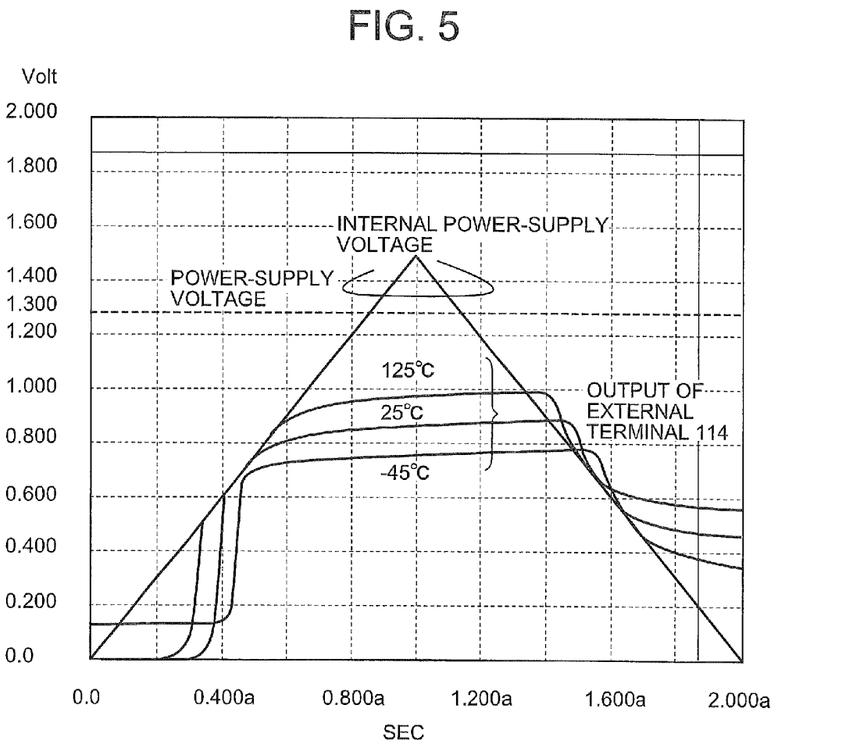
FIG. 5 is a simulation waveform diagram to explain problems in a semiconductor device described in Patent Document.

FIG. 5 shows, as an example of low-temperature operation, simulation waveforms obtained at a power-supply voltage of 1.3 V and variable temperatures. According to the result of the simulation, the voltage capable of being outputted to the external terminal 114 becomes 0.5 V to 0.8 V for a power-supply voltage of 1.3 at a temperature of 125° C., the voltage range becomes narrow to 0.6 V to 0.7 V at a temperature of 25° C., and the voltage cannot be outputted at a temperature of −45° C.

As shown in the simulation result, in a conventional circuit configuration, due to the effect of the VT of the transfer circuit during low-voltage operation, the measurement range of the internal power-supply voltage becomes narrow and the expected measurement of the internal power-supply voltage of a storage device becomes impossible.

A semiconductor device includes a power-supply circuit which produces a first voltage potential, a first terminal, a second terminal which receives a mode signal, an inverter which receives the mode signal and outputs an inverted mode signal, a first transfer circuit which includes a first transistor of a first conductivity type and a second transistor of a second conductivity type, the first transistor coupled between the power-supply circuit and a first node, the second transistor coupled between the power-supply circuit and the first node in parallel with the first transistor, a control gate of the first transistor supplied with the inverted mode signal and a control gate of the second transistor supplied with the mode signal, a resistor coupled between the first node and a second node, a second transfer circuit which includes a third transistor of the first conductivity type and a fourth transistor of the second conductivity type, the third transistor coupled between the second node and the first terminal, the fourth transistor coupled between the second node and the first terminal in parallel with the third transistor, a control gate of the third transistor supplied with the inverted mode signal and a control gate of the fourth transistor supplied with the mode signal, and a fifth transistor of the second conductivity type coupled between the second node and a first power source, the fifth transistor having a control gate terminal and a source terminal, the control gate terminal and the source terminal being coupled electrically to each other.

According to the exemplary aspect, it is possible to provide a semiconductor device capable of accurately performing the measurement of the internal power-supply voltage of the semiconductor device even in low-voltage operations by providing the resistance against overshoots and undershoots.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Exemplary Embodiment 1

Figure 1:
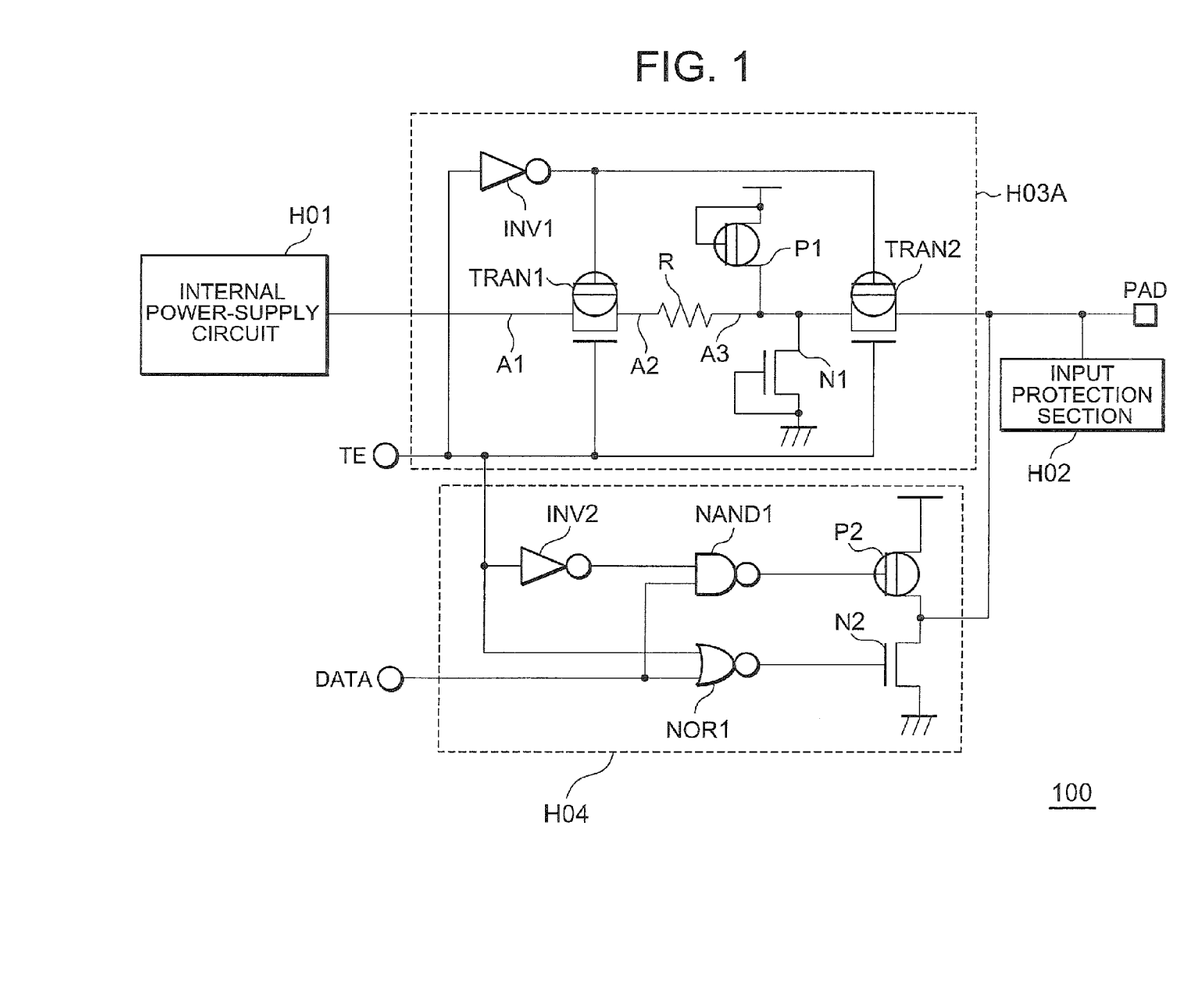
FIG. 1 is a circuit diagram showing the configuration of a semiconductor device related to an exemplary embodiment 1.

FIG. 1 is a circuit diagram showing the configuration of a semiconductor device 100 related to an exemplary embodiment of the present invention. As shown in FIG. 1, the semiconductor device 100 includes an internal power-supply circuit H01, an input protection section H02, a measurement circuit section H03A, an output circuit section H04, and an external terminal pad PAD.

The semiconductor device 100 provides an example in which input and output pins and the external terminal pad PAD which monitors the potential of the internal power-supply circuit H01 are shared. That is, the external terminal pad PAD is a common-use external terminal which outputs the internal potential of the internal power-supply circuit H01 and performs the output and input of signals with the outside. An output of the output circuit section H04 is connected to the external terminal pad PAD. The input protection section H02 is connected to a connection point between the output circuit section H04 and the external terminal pad PAD. The internal power-supply circuit H01 is connected to the connection point via the measurement circuit H03A.

The measurement circuit section H03A includes an inverter circuit INV1, a CMOC transfer circuit TRAN1, a clamp element PMOS transistor P1, a clamp element NMOS transistor N1, and a delay element R. A test mode signal TE from an unshown test mode generation section is inputted to the inverter circuit INV1. The CMOS transfer circuit TRAN1 has a configuration which is such that a PMOS transistor and an NMOS transistor are connected in parallel. One side of the CMOS transfer circuit TRAN1 is connected to an internal contact A1, which is an output of the internal power-supply circuit H01, and the other side is connected to an internal contact A2.

One side of the delay element R is connected to the internal contact A2, and the other side is connected to an internal contact A3. For example, a resistor element can be used as the delay element R. One side of the CMOS transfer circuit TRAN2 is connected to the internal contact A3, and the other side is connected to the external terminal pad PAD. Therefore, the CMOS transfer circuits TRAN1 and TRAN2 are provided between an output of the internal power-supply circuit 1101 and the external terminal pad PAD. Also, the delay element R is provided between the CMOS transfer circuits TRAN1, and TRAN2.

A clamp element which suppresses a potential variation is provided between the CMOS transfer circuit TRAN1 and the CMOS transfer circuit TRAN2. In the exemplary embodiment, the clamp element PMOS transistor P1 and the clamp element NMOS transistor N1 are provided. A drain of the clamp element NMOS transistor N1 is connected to the internal contact A3, and a gate and a source are connected to a GND potential. A drain of the clamp element PMOS transistor P1 is connected to the internal contact A3, and a gate and a source are connected to a power supply.

A test mode signal TE is inputted to gates of the NMOS transistors of the CMOS transfer circuits TRAN1 and TRAN2. Gates of the PMOS transistors of the CMOS transfer circuits TRAN1 and TRAN2a are connected to an output of the inverter circuit INV1. The CMOS transfer circuits TRAN1 and TRAN2 are controlled by a test mode signal TE.

The clamp element PMOS transistor P1 and the clamp element PMOS transistor N1 are composed of transistors having a VT which is lower than the VT of the CMOS transfer circuits TRAN1 and TRAN2. Incidentally, although an example in which transistors are used as the clamp elements is shown here, it is also possible to use diodes.

The semiconductor device 100 includes an input protection section H02 and an output protection section H04. Because the external terminal pad PAD is shared, the external terminal pad PAD outputs a data signal DATA from the output circuit section H04. The output circuit section H04 includes an inverter circuit INV2, a NAND circuit NAND1, a NOR circuit NOR1, a PMOS output transistor P2, and an NMOS output transistor N2.

A test mode signal TE is inputted to the inverter circuit INV2. An output of the inverter circuit INV2 and a data signal DATA are inputted to the NAND circuit NAND1. An output of the NAND circuit NAND1 is connected to a gate of the PMOS output transistor P2.

A test mode signal TE and a data signal DATA are inputted to the NOR circuit NOR1. An output of the NOR circuit NOR1 is connected to a gate of the NMOS output transistor N2. A drain of the PMOS output transistor P2 and a drain of the NMOS output transistor N2 are connected together.

A source of the PMOS output transistor P2 is connected to the power supply. A source of the NMOS output transistor N2 is connected to a GND potential. Hereinafter, the VT of the clamp element PMOS transistor P1 is referred to as VTP1 and the VT of the clamp element NMOS transistor N1 is referred to as VTN1.

In the semiconductor device shown in FIG. 6, if the VT of the PMOS transistor is denoted by VTP, then the VT of the NMOS transistor is denoted by VTN and the measurement range is denoted by VS, then the minimum operating voltage VL at which the VS range can be measured is expressed by the following expression (1).

$$VL = VTP + VTN + VS \qquad (1)$$

The potential capable of being outputted is in the range of VTP to (VCC−VTN). For example, if VTP=0.6 V, VTN=0.6 V, and VS=0.6 V, then the minimum operating voltage VL is VL=0.6+0.6+0.6=1.8 V, and the potential capable of being outputted becomes 0.6 V to 1.2 V.

On the contrary, in the semiconductor device related to the exemplary embodiment, the minimum operating voltage VL1 is expressed by the following expression (2).

$$VL1 = VTP1 \pm VTN1 \qquad (2)$$

For example, if VTP=0.6 V and VTN1=0.6 V, then the minimum operating voltage VL1 is VL1=1.2 V, and potentials between 0 V and VCC can be outputted.

As described above, even in the potential measurement of the internal power supply during low-voltage operations, accurate potential measurement can be similarly realized.

Figure 2A:
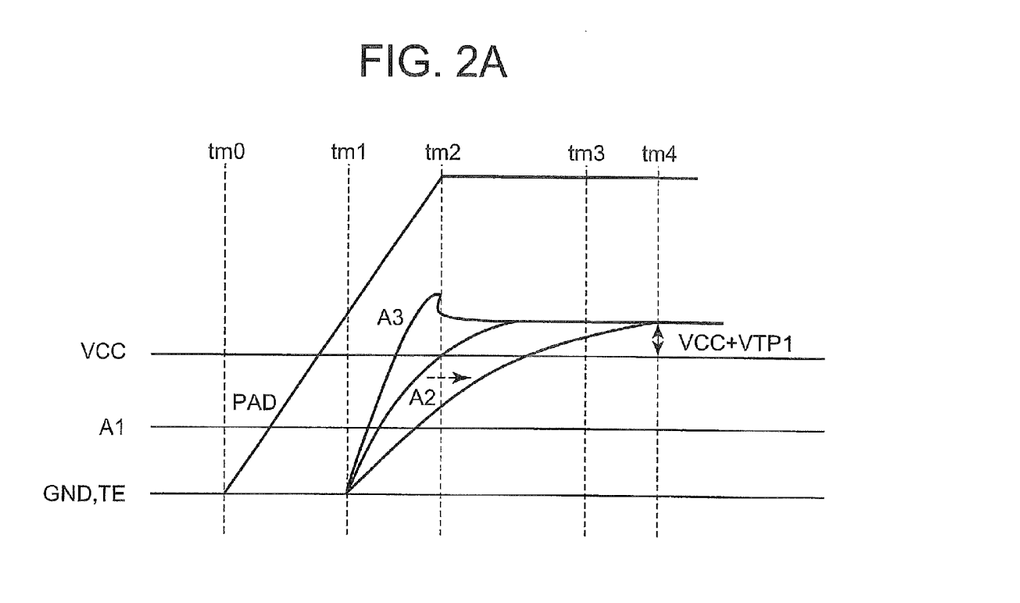
FIG. 2A is a timing chart to explain the operation of the semiconductor device related to the exemplary embodiment 1.
Figure 2B:
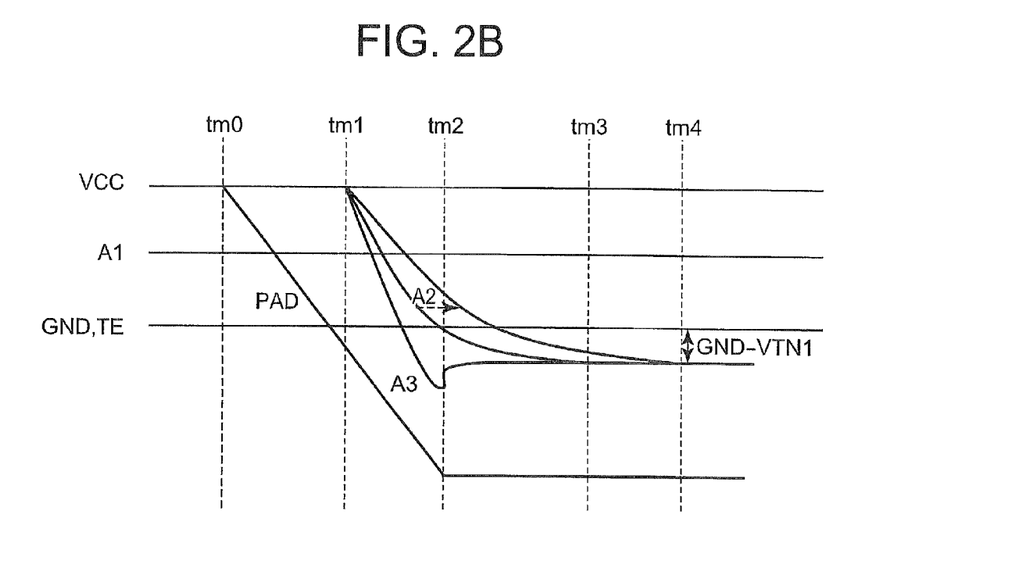
FIG. 2B is a timing chart to explain the operation of the semiconductor device related to the exemplary embodiment 1.

Next, the operation of the semiconductor device 100 will be described with reference to FIGS. 2A and 2B. FIGS. 2A and 2B are timing charts to explain the operation of the semiconductor device 100. In a measurement circuit section H03A of internal power-supply voltage, when the test mode signal TE is in a HIGH state, both the CMOS transfer circuit TRAN1 and the CMOS transfer circuit TRAN2 turn on.

The clamp element PMOS transistor P1 and the clamp element NMOS transistor N1 in the output circuit section H03 turn off. For this reason, the potential of the internal contact A3 is outputted to the external terminal pad PAD. Measuring the potential of the internal contact A3 means measuring the voltage of the internal power-supply circuit H01.

When the test mode signal TE is in a LOW state, both of the CMOS transfer circuits TRAN1 and TRAN2 turn off. For this reason, the data from the output circuit section H04 is outputted to the external terminal pad PAD. Incidentally, the operation of the output circuit section H04 is well-known and a description of the operation is omitted here.

In the exemplary embodiment, the internal power-supply voltage is measured in low-voltage operations and, therefore, the CMOS transfer circuits TRAN1 and TRAN2 are adopted in the measurement circuit section 1103 of internal power-supply voltage. It is inevitable to prevent effects on measured points when overshoots and undershoots of not less than the power-supply voltage have entered the external terminal pad PAD. Therefore, the operations will be described with reference to the timing charts of FIGS. 2A and 2B.

First, the operation to block the effect of overshoots is described with the aid of FIG. 2A. At tm0 the test mode signal TE is in a LOW state. When a waveform of an overshoot enters the external terminal pad PAD at tm1, the PMOS transistor of the CMOS transfer circuit TRAN2 turns on and transmits the potential of the external terminal pad PAD to the internal contact A3. When the timing becomes tm2, the clamp element PMOS transistor P1 turns on and ensures that the potential of the internal contact A3 does not become not less than VCC+VTP1.

When the timing becomes tm3, also the potential of the internal contact A2 becomes the same potential as that of the internal contact A3. Because the CMOS transfer circuit TRAN1 has a higher VT than the clamp element PMOS transistor P1, the CMOS transfer circuit TRAN1 keeps an off state even at tm4. Hence, the effect of overshoots of not less than the power supply is not transmitted to the internal power-supply circuit H01. As a result, it is possible to keep the voltage of the internal power-supply circuit H01.

Incidentally, when a waveform of a steep overshoot has entered the external terminal pad PAD as shown at tm0 to tm1 of FIG. 2A, the internal contact A3 may sometimes have voltages of not less than VCC+VTP1 temporarily at tm1 to tm2. However, the delay element R for delay purposes is provided between the internal contact A3 and the internal contact A2. For this reason, a rise in the potential of the internal contact A2 requires time.

Because of this, the clamp element PMOS transistor P1 turns on before the internal contact A2 obtains a potential of not less than VCC+VTP1, and at tm4, it is possible to fix the potential of the internal contact A3 at VCC+VTP1. Hence, the CMOS transfer circuit TRAN1 keeps an off state and it is possible to ensure that the effect of a steep overshot of the external terminal pad PAD is not transmitted to the internal contact A1. As a result, it is possible to keep the voltage of the internal power-supply circuit H01.

Next, with the aid of FIG. 2B, a description will be given of the operation to block the effect of a case where an undershoot of not more than GND has entered the external terminal pad PAD. The clamp element NMOS transistor N1 has a function similar to that of the clamp element PMOS transistor P1. That is, the clamp element NMOS transistor N1 turns on and ensures that the potential of the internal contact A3 does not become not more than VCC−VTN1.

Because the CMOS transfer circuit TRAN1 has a higher VT than the clamp element NMOS transistor N1, even at tm4 the CMOS transfer circuit TRAN1 keeps an off state. For this reason, the effect of undershoots of not more than a GND potential is not transmitted to the internal contact A1 of the measurement circuit section H03 of internal power-supply voltage. Hence, it is possible to keep the voltage of the internal power-supply circuit H01.

When a steep undershoot has been inputted to the external terminal pad PAD as shown at tm1 to tm2 of FIG. 2B, the delay element R works in the same manner as described above. For this reason, the potential is fixed by the clamp element NMOS transistor N1 to GND−VTN1 at tm3 to tm4. The CMOS transfer circuit TRAN1 keeps an off state and does not transmit the effect of the steep undershoot of the external terminal pad PAD to the internal contact A1. Hence, it is possible to keep the voltage of the internal power-supply circuit H01.

It is possible to realize a measurement circuit of an internal power supply which is not affected by overshoots and undershoots of an external terminal by providing a clamp circuit in this manner.

As described above, in the exemplary embodiment, the two CMOS transfer circuits TRAN1 and TRAN2 controlled by test mode signals are provided between the internal potential contact, which is an object to be measured, and the external tellninal. One side of the CMOS transfer circuit TRAN1 is connected to the measured point and the other side is connected to the delay element R. The other side of the delay element R is connected to the CMOS transfer circuit TRAN2.

The external terminal is connected to the other side of the CMOS transfer circuit TRAN2. P-channel and N-channel transistors are connected, as clamp elements, to a contact between the delay element R and the CMOS transfer circuit TRAN2. The clamp elements are Ruined from transistors having a lower VT than the transistors constituting the CMOS transfer circuit.

As a result, in the present invention, it is possible to provide the resistance against overshoots and undershoots and to improve the minimum operating voltage of a potential to be measured. Furthermore, it is also possible to expand the range of internal potentials capable of being measured.

Exemplary Embodiment 2

Figure 3:
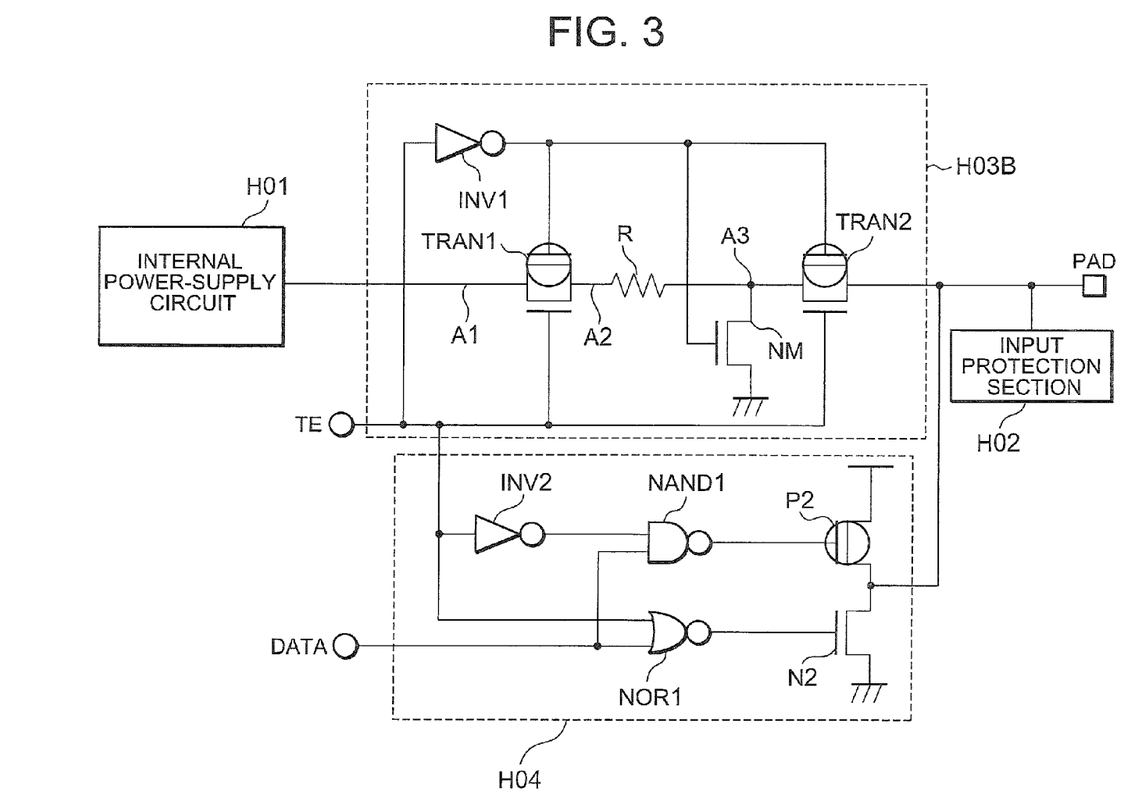
FIG. 3 is a circuit diagram showing the configuration of a semiconductor device related to an exemplary embodiment 2.

FIG. 3 is a circuit diagram showing the configuration of a semiconductor device 200 related to an exemplary embodiment 2. As shown in FIG. 2, the semiconductor device 200 includes an internal power-supply circuit H01, an input protection section H02, a measurement circuit section H03B, an output circuit section H04, and an external terminal pad PAD. In this exemplary embodiment, what is different from the exemplary embodiment 1 is the configuration of a measurement circuit section H03B of internal power-supply voltage.

The measurement circuit section 03B solves the problem that the internal potential cannot be measured by using a CMOS transfer circuit. The measurement circuit section H03B blocks the effect of overshoots and undershoots from the external terminal pad PAD on a measured point by using elements whose number is smaller than in the exemplary embodiment 1.

As shown in FIG. 3, in this exemplary embodiment, a clamp element NMOS transistor NM is provided in place of the clamp element PMOS transistor P1 and clamp element NMOS transistor N1 of the exemplary embodiment 1. The clamp element NMOS transistor NM prevents a measured point from being affected by undershoots and overshoots from the external terminal pad PAD.

An internal contact A3 in the measurement circuit section H03B is connected to a drain of the clamp element NMOS transistor NM. A test mode signal TE which comes to a HIGH state during measurement is connected to a gate of the clamp element NMOS transistor NM and a source is connected to a GND. The VT of the NMOS transistor NM (hereinafter referred to as VTMN) is lower than the VT of NMOS transistors constituting CMOS transfer circuits TRAN1 and TRAN2.

For the minimum operating voltage of the semiconductor device of FIG. 6, if the VT of the PMOS transistor is denoted by VTP, the VT of the NMOS transistor is denoted by VTN and the measurement range is denoted by VS, then the minimum operating voltage VL at which the VS can be measured is expressed by the following expression (3).

$$VL = VTP + VTN + VS \qquad (3)$$

The potential capable of being outputted is in the range of VTP to (VCC−VTN). For example, if VTP=0.6 V, VTN=0.6 V, and VS=0.6 V, then the minimum operating voltage VL is VL=0.6+0.6+0.6=1.8 V, and the potential capable of being outputted becomes 0.6 V to 1.2 V.

On the contrary, in the circuit of this exemplary embodiment, the minimum operating voltage VL1 is expressed by the following expression (4).

$$VL1 = VTP1 + VTN1 \qquad (4)$$

If VTP=0.6 V and VTN1=0.6 V, then the minimum operating voltage VL1 is VL1=1.2 V, and potentials between 0 V and VCC can be outputted.

Figure 4A:
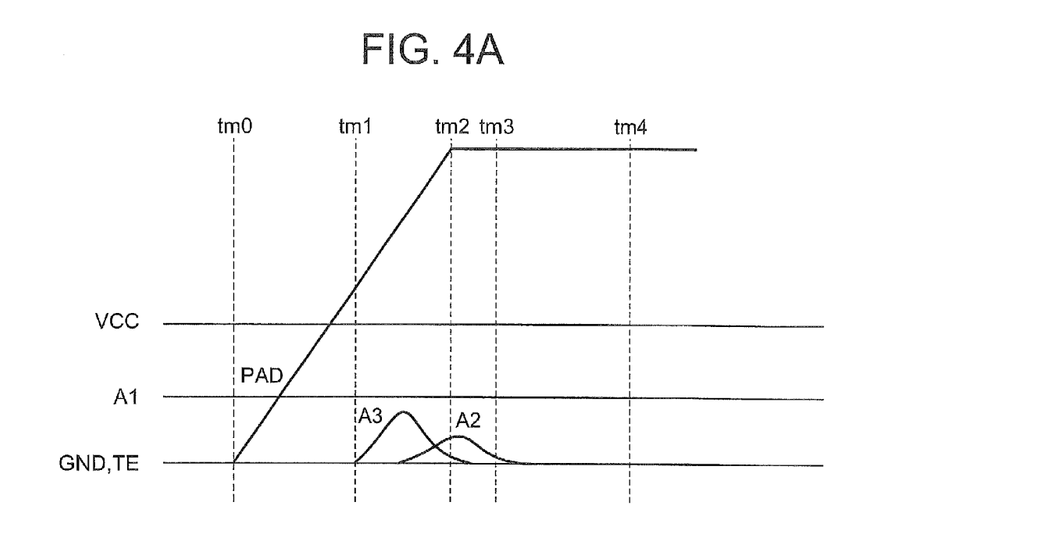
FIG. 4A is a timing chart to explain the operation of the semiconductor device related to the exemplary embodiment 2.
Figure 4B:
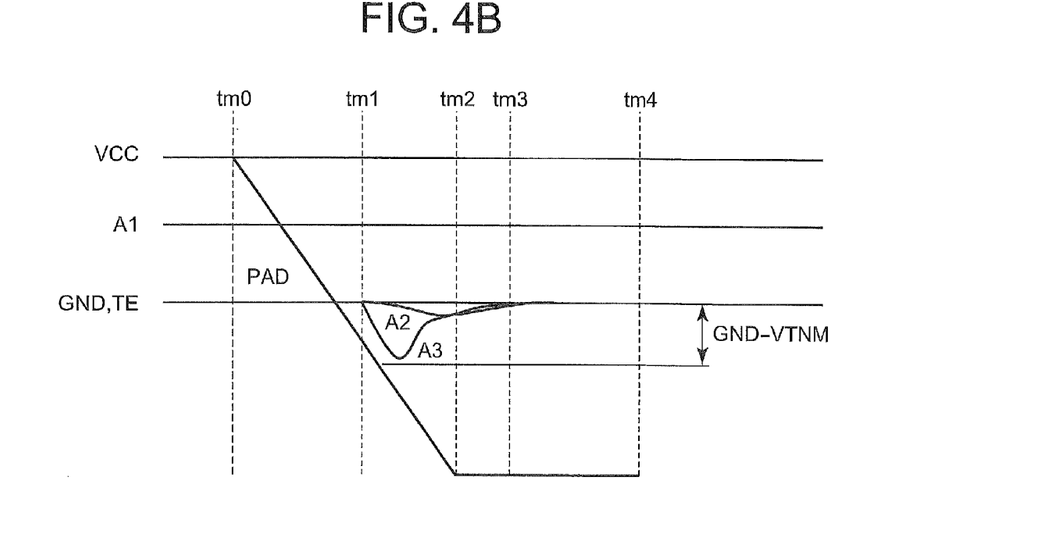
FIG. 4B is a timing chart to explain the operation of the semiconductor device related to the exemplary embodiment 2.

FIGS. 4A and 4B are timing charts to explain the operation of the semiconductor device 200 related to the exemplary embodiment 2. The difference between the operation of the semiconductor device 200 and the operation of the semiconductor device 100 is that when both the CMOS transfer circuit TRAN1 and the CMOS transfer circuit TRAN2 are off during ordinary operations, effects of overshoots and undershoots occurring when data is outputted from the output circuit section H04 are not transmitted.

The operation to block the effect of overshoots will be described with reference to FIG. 4A. It is assumed that at tm0, the test mode signal TE is in a LOW state. When an overshoot voltage of not less than a VCC is applied to the external terminal pad PAD at tm1, the PMOS transistor of the CMOS transfer circuit TRAN2 turns on at not less than VCC+VTP and a charge tends to flow into the internal contact 3 from the external terminal pad PAD. However, because the clamp element NMOS transistor NM turns on, at tm2 the potential of the internal contact A3 is extracted by the GND potential through the clamp element NMOS transistor NM.

Furthermore, even when a steep overshoot has occurred, a delay occurs in the potential rise of the internal contact A2 because of the presence of the delay element R, and also the potential of the internal contact A2 is extracted by the GND potential, no potential variation of the internal contact A1 occurs. Hence, as indicated at tm0 to tm4 the internal contact A1 can keep the voltage of the internal power-supply circuit H01 without being affected by the overshoot.

Next, the operation to block the effect of undershoots is described with the aid of FIG. 4B. It is assumed that at tm0, the test mode signal TE is in a LOW state. When at tm1 an undershoot voltage of not more than a GND potential has been applied, the potential of the internal contact A3 tends to become a GND−VTNM potential temporally. However, the clamp element NMOS transistor NM comes to an on state, a charge is supplied to the internal contact A3, and the internal contact A3 keeps a GND potential. For this reason, there is no potential variation in the internal contact A1. Hence, as indicated at tm0 to tm4 the internal contact A1 can keep the voltage of the internal power-supply circuit H01 without being affected by the undershoot.

Furthermore, even when a steep undershoot has occurred, a delay occurs in the potential drop of the internal contact A2 because of the presence of the delay element R, and a potential drop of the internal contact A2 is suppressed. Furthermore, because the VT of the NMOS transistor of the CMOS transfer circuit TRAN1 is set at a higher value than the VTNM, there is no potential variation in the internal contact A1. Hence, as indicated at tm0 to tm4 the internal contact A1 can keep the voltage of the internal power-supply circuit H01.

In this manner, in the exemplary embodiment 2, by using CMOS transfer circuits, it is possible to solve the problem that it is impossible to measure the internal potential during low-voltage operation. Furthermore, the CMOS transfer circuits TRAN1 and TRAN2 controlled by the test mode signal TE are connected between a measured point and the output terminal and the clamp element NMOS transistor NM is provided between the CMOS transfer circuits. The clamp element NMOS transistors NM having a lower VT than the transistors constituting the CMOS transfer circuits TRAN1 and TRAN2 are used.

As a result, it is possible to solve the problem that a measured point is affected by overshoots or undershoots from the output terminal. Furthermore, the speed of a potential variation is made slow by providing the delay element R between the CMOS transfer circuit TRAN1 on the side close to the measured point and the clamp element NMOS transistor NM. As a result, even when a steep overshoot or undershoot has occurred, it is possible to suppress the effect received by the measured point.

As described above, in the present invention, the resistance against overshoots and undershoots are provided and it is possible to improve the minimum operating voltage of a potential to be measured compared to conventional cases. Furthermore, it is possible to expand the range of internal potentials capable of being measured.

Incidentally, the present invention is not limited to the above-described exemplary embodiments and can be appropriately changed so long as changes do not depart from the gist.

Further, it is noted that Applicant's intent is to encompass equivalents of all claim elements, even if amended later during prosecution.

What is claimed is:

1. A semiconductor device, comprising:
   a power-supply circuit which produces a first voltage potential;
   a first terminal;
   a second terminal which receives a mode signal;
   an inverter which receives the mode signal and outputs an inverted mode signal;
   a first transfer circuit which includes a first transistor of a first conductivity type and a second transistor of a second conductivity type, the first transistor coupled between the power-supply circuit and a first node, the second transistor coupled between the power-supply circuit and the first node in parallel with the first transistor, a control gate of the first transistor supplied with the inverted mode signal and a control gate of the second transistor supplied with the mode signal;
   a resistor coupled between the first node and a second node;
   a second transfer circuit which includes a third transistor of the first conductivity type and a fourth transistor of the second conductivity type, the third transistor coupled between the second node and the first terminal, the fourth transistor coupled between the second node and the first terminal in parallel with the third transistor, a control gate of the third transistor supplied with the inverted mode signal and a control gate of the fourth transistor supplied with the mode signal, and
   a fifth transistor of the second conductivity type coupled between the second node and a first power source, the fifth transistor having a control gate terminal and a source terminal, the control gate terminal and the source terminal being coupled electrically to each other.

2. The semiconductor device according to claim 1, further comprising a sixth transistor of the first conductivity type coupled between the second node and a second power source, the sixth transistor comprising a control gate terminal and a source terminal being coupled electrically to each other.

3. The semiconductor device according to claim 1, wherein the control gate terminal and the source terminal of the fifth transistor are coupled electrically to each other in response to the inverted mode signal.

4. The semiconductor device according to claim 3, wherein the control gate terminal and the source terminal of the fifth transistor are coupled electrically to each other at least while the first and second transfer circuit turn off.

5. The semiconductor device according to claim 1, further comprising an output circuit which outputs data through the first terminal based on the mode signal.

6. The semiconductor device according to claim 1, wherein the fifth transistor has a threshold value lower than that of the second transistor.

7. The semiconductor device according to claim 2, wherein the sixth transistor has a threshold value lower than that of the first transistor.

* * * * *